United States Patent
Heston

(10) Patent No.: US 7,154,337 B2
(45) Date of Patent: Dec. 26, 2006

(54) AMPLIFYING A SIGNAL USING A CONTROL MODULATOR THAT PROVIDES A BIAS RESISTANCE

(75) Inventor: Scott M. Heston, Dallas, TX (US)

(73) Assignee: Raytheon Company, Waltham, MA (US)

( * ) Notice: Subject to any disclaimer, the term of this patent is extended or adjusted under 35 U.S.C. 154(b) by 58 days.

(21) Appl. No.: 10/977,007

(22) Filed: Oct. 28, 2004

(65) Prior Publication Data
US 2006/0091956 A1    May 4, 2006

(51) Int. Cl.
H03G 3/10    (2006.01)
(52) U.S. Cl. ................. 330/285; 330/10; 330/127
(58) Field of Classification Search ........... 330/285, 330/10, 127
See application file for complete search history.

(56) References Cited

U.S. PATENT DOCUMENTS

| | | | | |
|---|---|---|---|---|
| 3,721,771 | A * | 3/1973 | Greneker | 455/462 |
| 5,280,633 | A * | 1/1994 | Camiade et al. | 455/79 |
| 5,973,565 | A | 10/1999 | Bhatia | 330/277 |
| 6,476,647 | B1 * | 11/2002 | Rapakko | 327/91 |
| 6,721,549 | B1 * | 4/2004 | Lee et al. | 455/234.1 |
| 6,987,422 | B1 * | 1/2006 | Vice | 330/285 |
| 2002/0119762 | A1 | 8/2002 | Ogihara | 455/234.1 |

FOREIGN PATENT DOCUMENTS

WO    WO 00/62418    10/2000

OTHER PUBLICATIONS

"Types of Bias", Electrical Engineering Training Series, Integrated Publishing *The Most Informative Site on the Internet*, http://www.infodotinc.com/neets/book7/25d.htm, 5 pages.
PCT, Notification of Transmittal of The International Search Report and The Written Opinion of The International Searching Authority, or The Declaration, International Application No. PCT/US2005/037520; dated Feb. 10, 2006.

* cited by examiner

*Primary Examiner*—Patricia Nguyen
(74) *Attorney, Agent, or Firm*—Baker Botts L.L.P.

(57) ABSTRACT

According to one embodiment of the present invention, an amplifier includes an amplifying transistor coupled to a ground and operable to amplify a received signal. One or more bias components provide a bias resistance for the amplifying transistor. The one or more bias components include a control modulator coupled in series between the amplifying transistor and the ground. The control modulator receives a control signal and modulates the amplifying transistor in response to the control signal.

24 Claims, 2 Drawing Sheets

AMPLIFYING A SIGNAL USING A
CONTROL MODULATOR THAT PROVIDES
A BIAS RESISTANCE

TECHNICAL FIELD

This invention relates generally to the field of amplifiers and more specifically to amplifying a signal using a control modulator that provides a bias resistance.

BACKGROUND

Transistor amplifiers include a transistor that increases the magnitude of an applied signal. A transistor amplifier may be biased to maintain appropriate current and voltage in the transistor. Self-biased amplifiers typically use a source resistor to provide the bias resistance. Self-biased amplifiers, however, typically require additional components to modulate the transistors. It is generally desirable to relax the requirement for additional components.

SUMMARY OF THE DISCLOSURE

In accordance with the present invention, disadvantages and problems associated with previous techniques for amplifying signals may be reduced or eliminated.

According to one embodiment of the present invention, an amplifier includes an amplifying transistor coupled to a ground and operable to amplify a received signal. One or more bias components provide a bias resistance for the amplifying transistor. The one or more bias components include a control modulator coupled in series between the amplifying transistor and the ground. The control modulator receives a control signal and modulates the amplifying transistor in response to the control signal.

Certain embodiments of the invention may provide one or more technical advantages. A technical advantage of one embodiment may be that a control modulator of an amplifier is used to modulate the amplifier and to provide a bias resistance to the amplifier. Another technical advantage of one embodiment may be that a control signal that provides instructions to the control modulator may operate with respect to ground. Thus, the voltage of the control signal is not required to be increased to the drain voltage of the amplifier. Another technical advantage of one embodiment may be that since the voltage of the control signal is not required to be increased, the amplifier may require fewer components.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
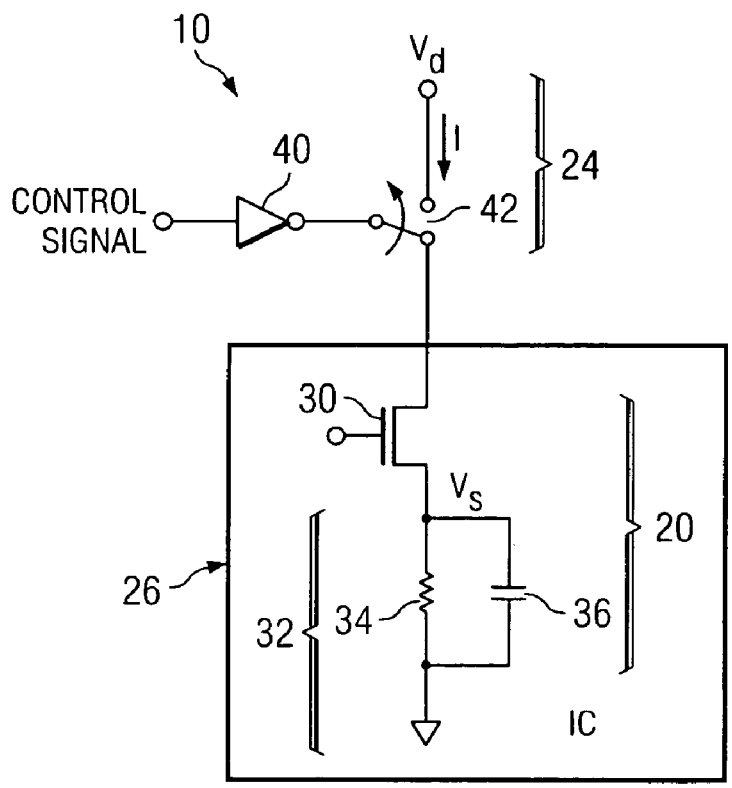
FIG. 1 is a diagram illustrating a typical self-biased amplifier that uses a source resistor to provide a bias resistance for the amplifier.
Figure 2:
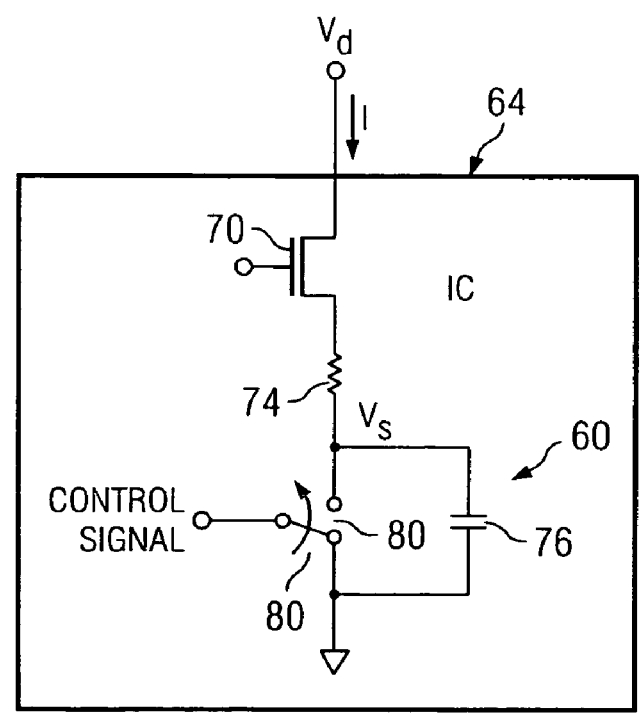
FIG. 2 is a diagram illustrating one embodiment of a self-biased amplifier that uses a control modulator to provide a bias resistance for the amplifier.
Figure 3:
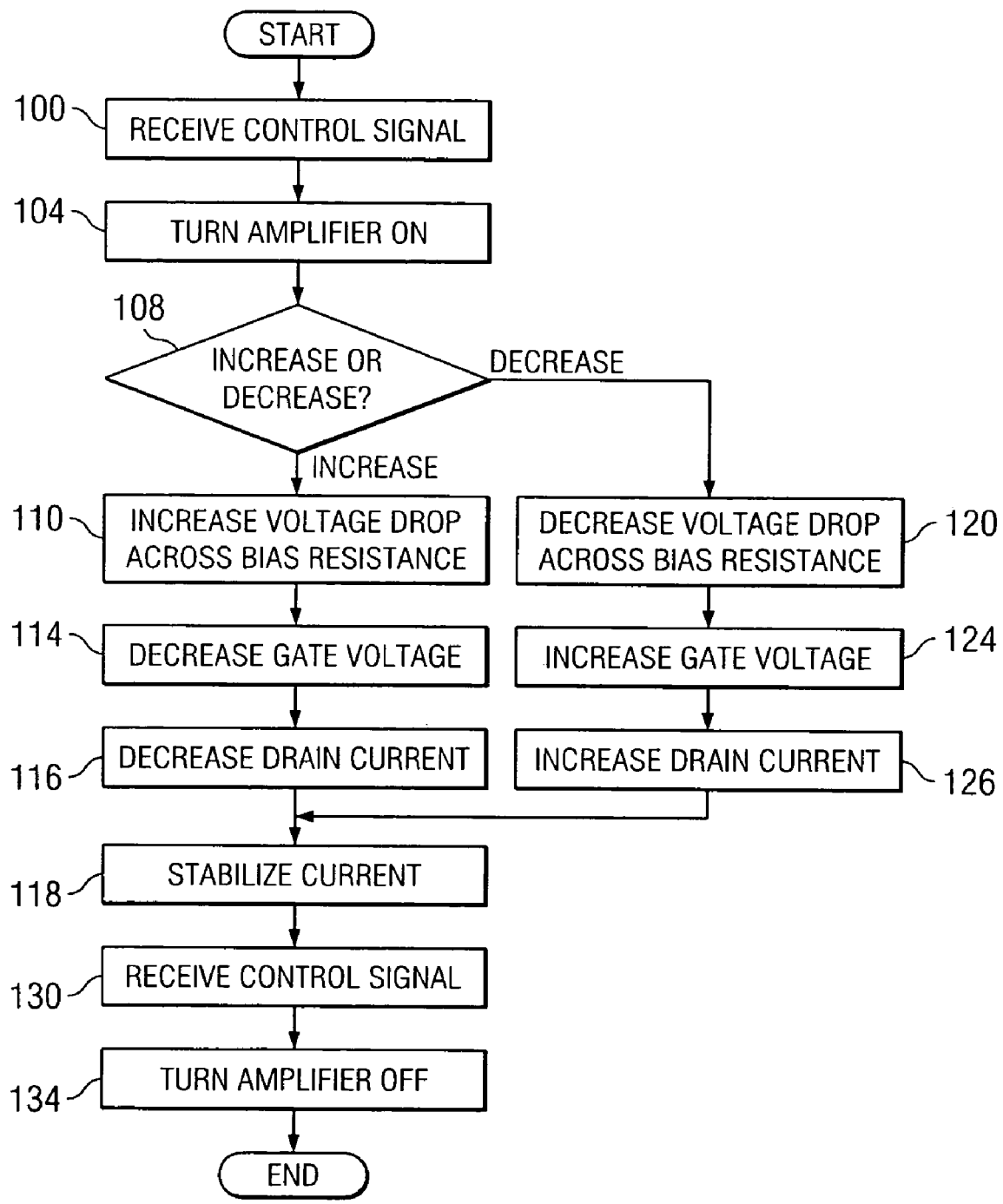
FIG. 3 is a flowchart illustrating one embodiment of a method for amplifying a signal using the amplifier of FIG. 2.

Embodiments of the present invention and its advantages are best understood by referring to FIGS. 1 through 3 of the drawings, like numerals being used for like and corresponding parts of the various drawings.

FIG. 1 is a diagram illustrating a typical self-biased amplifier 10 that uses a source resistor 34 to provide a bias resistance for amplifier 10. Amplifier 10 includes amplifying components 20 and control components 24. Amplifying components 20 are located on an integrated circuit (IC) 26, while control components 24 are external to integrated circuit 26.

Amplifying components 20 amplify an input signal, and include a grounded transistor 30 and a stability/bias circuit 32. Transistor 30 amplifies an input signal. Stability circuit 32 includes a source resistor 34 and a capacitor 36. Source resistor 34 provides a bias resistance. An increase in the drain current I causes an increase in the voltage drop across source resistor 34. The increase in the voltage drop causes the gate voltage $V_g$ to decrease, which may stabilize the original increase in the drain current.

Control components 24 switch amplifier 10 from an on state to an off state and from an off state to an on state in response to a control signal. Control components 24 include a level shifter/inverter 40 and a drain modulator 42. Level shifter/inverter 40 increases the voltage of the control signal to match drain voltage $V_d$. Typically, the voltage of the control signal is usually on the order of half the drain voltage $V_d$. Level shifter/inverter 40 also inverts a negative control signal to a positive control signal.

FIG. 2 is a diagram illustrating one embodiment of a self-biased amplifier 60 that uses a control modulator 80 to provide a bias resistance for amplifier 60. According to the illustrated embodiment, amplifier 60 may comprise a portion of an integrated circuit 64. Integrated circuit 64 may refer to any suitable integrated circuit, and may comprise any suitable semiconductor material such as silicon or gallium arsenide (GaAs). According to one embodiment, integrated circuit 64 may comprise a monolithic microwave integrated circuit (MMIC).

According to the illustrated embodiment, amplifier 60 includes an amplifying transistor 70, a resistor 74, a capacitor 76, and a control modulator 80 coupled as shown. Amplifying transistor 70 may comprise any suitable transistor operable to amplify a signal. For example, transistor 30 may comprise a radio frequency (RF) field effect transistor (FET).

One or more bias components of amplifier 70 may be used to provide a bias resistance. The bias components may placed in series with amplifying transistor 70, between the source of transistor 70 and ground. According to one embodiment, the resistance of transistor 80 may be selected to provide a bias resistance for amplifier 70. According to another embodiment, amplifier 60 may include resistor 74. The resistance of resistor 74 and transistor 80 may be selected to provide the bias resistance.

Bias resistance refers to the resistance of one or more components, where the resistance generates a desired bias voltage when current flows through the components. The bias resistance allows for feedback voltage such that an increase in the drain current I causes an increase in the voltage drop across the source bias resistor. The source bias resistance may refer to the resistance of switch 80 or the resistance of switch 80 in series with resistor 74. The voltage drop causes the gate voltage $V_g$ to decrease, which may stabilize the original increase in the drain current.

In the illustrated embodiment, the bias resistance initiates a positive source voltage $V_s$ to generate a negative gate voltage $V_g$. As an example, the bias resistance may be approximately less than 12 ohms, such as 2 to 10 ohms. A positive source voltage $V_s$ of approximately 0.7 to 1.0 volts may be initiated to generate a negative gate voltage $V_g$ of approximately −0.5 to −0.7 volts.

Capacitor 76 may comprise any suitable bypass capacitor having a capacitance to provide a ground for the source of transistor 70, which may reduce variation of the amplified signal. For example, capacitor 76 may have a capacitance of approximately two to six Pico farads. Control modulator 80 may comprise any suitable transistor operable to modulate amplifier 60. For example, control modulator 80 may comprise a field effect transistor operable to switch amplifier 60 from an on state to an off state and from an off state to an on state. Control modulator 80 may modulate amplifier 60 in response to a control signal. A control signal may refer to a signal that directs the operation of amplifier 60, and may comprise any suitable signal such as a transistor-transistor logic (TTL) signal.

According to one embodiment, the control signal modulates switch 80 with respect to ground. Accordingly, the control signal typically is not required to be inverted or amplified. The control signal may be sent by a control system that controls the operation of the amplifier. The control system may be part of integrated circuit 64, or may be external to integrated circuit 64. Accordingly, control modulator 80 may control amplifier 60 without the need for the control components 24 of amplifier 10 of FIG. 1, for example, inverter 40 and drain modulator 42. Thus, amplifier 60 may use fewer components.

Modifications, additions, or omissions may be made to amplifier 60 without departing from the scope of the invention. For example, either control transistor 80 or a combination of control modulator 80 and resistor 74 may provide the bias resistance. Moreover, the components of amplifier 60 may be integrated or separated according to particular needs. Additionally, operations of amplifier 60 may be performed using any suitable logic comprising software, hardware, other logic, or any suitable combination of the preceding. As used in this document, "each" refers to each member of a set or each member of a subset of a set.

FIG. 3 is a flowchart illustrating one embodiment of a method for amplifying a signal using amplifier 60 of FIG. 2. The method begins at step 100, where control modulator 80 of amplifier 60 receives a control signal. The control signal instructs control modulator 80 to turn amplifier 60 on. Control modulator 80 turns amplifier 60 on in response to the control signal at step 104.

Drain current I may increase or decrease at step 108, initiating a response in accordance with the bias resistance provided by control modulator 80. Steps 110 through 116 describe the response if drain current I increases. The voltage drop across the bias resistance increases at step 110 in response to the increased drain current I. The gate voltage $V_g$ decreases in response to the increased voltage drop at step 114. The drain current decreases in response to the decreased gate voltage $V_g$ at step 116. The original increase in the drain current is stabilized by the decreased gate voltage $V_g$ at step 118.

Steps 120 through 126 describe the response if drain current I decreases. The voltage drop across the bias resistance decreases at step 120 in response to the decreased drain current I. The gate voltage $V_g$ increases in response to the decreased voltage drop at step 124. The drain current increases in response to the decreased gate voltage $V_g$ at step 126. The original decrease in the drain current is stabilized by the increased gate voltage $V_g$ at step 120.

Control modulator 80 receives another control signal at step 130. The control signal instructs control modulator 80 to turn amplifier 60 off. Control modulator 80 turns amplifier 60 off in response to the control signal at step 134. After turning amplifier 60 off, the method terminates.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that a control modulator of an amplifier is used to modulate the amplifier and to provide a bias resistance to the amplifier. Another technical advantage of one embodiment may be that a control signal that provides instructions to the control modulator may operate with respect to ground. Thus, the voltage of the control signal is not required to be increased to the drain voltage of the amplifier. Another technical advantage of one embodiment may be that since the voltage of the control signal is not required to be increased, the amplifier may require fewer components.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. An amplifier for amplifying a signal, comprising:
   an amplifying transistor coupled to a ground and operable to:
      receive a signal; and
      amplify the received signal; and
   one or more bias components coupled to the amplifying transistor, the one or more bias components operable to provide a bias resistance for the amplifying transistor, the one or more bias components comprising a control modulator coupled in series between the amplifying transistor and the ground, the control modulator operable to:
      receive a first control signal;
      enable the amplifying transistor in response to the first control signal;
      receive a second control signal; and
      disable the amplifying transistor in response to the second control signal.

2. The amplifier of claim 1, wherein the one or more bias components are operable to provide the bias resistance for the amplifying transistor by:
   decreasing a gate voltage in response to an increase in a drain current, the decrease in the gate voltage operable to stabilize the increase in the drain current; and
   increasing the gate voltage in response to a decrease in the drain current, the increase in the gate voltage operable to stabilize the decrease in the drain current.

3. The amplifier of claim 1, further comprising a capacitor coupled in parallel with the control modulator and operable to reduce variation of the amplified signal.

4. The amplifier of claim 1, wherein the control modulator comprises a field effect transistor.

5. The amplifier of claim 1, wherein the one or more bias components further comprises a resistor coupled in series to the control modulator.

6. The amplifier of claim 1, wherein the first control signal and the second control signal switch the modulating transistor with respect to the ground.

7. A method for amplifying a signal, comprising:
receiving a first control signal at a control modulator of one or more bias components, the one or more bias components coupled to an amplifying transistor, the amplifying transistor coupled to a ground, the control modulator coupled in series between the amplifying transistor and the ground;
enabling the amplifying transistor in response to the first control signal using the control modulator;
receiving a signal at the amplifying transistor;
amplifying the received signal using the amplifying transistor;
providing a bias resistance for the amplifying transistor using the one or more bias components coupled to the amplifying transistor;
receiving a second control signal at the control modulator; and
disabling the amplifying transistor in response to the second control signal using the control modulator.

8. The method of claim 7, wherein providing the bias resistance for the amplifying transistor further comprises:
decreasing a gate voltage in response to an increase in a drain current, the decrease in the gate voltage operable to stabilize the increase in the drain current; and
increasing the gate voltage in response to a decrease in the drain current, the increase in the gate voltage operable to stabilize the decrease in the drain current.

9. The method of claim 7, further comprising reducing variation of the amplified signal using a capacitor coupled in parallel with the control modulator.

10. The method of claim 7, wherein the control modulator comprises a field effect transistor.

11. The method of claim 7, wherein the one or more bias components further comprises a resistor coupled in series to the control modulator.

12. The method of claim 7, wherein the first control signal and the second control signal switch the modulating transistor with respect to the ground.

13. An amplifier for amplifying a signal, comprising:
an amplifying transistor coupled to a ground and operable to:
receive a signal; and
amplify the received signal;
one or more bias components coupled to the amplifying transistor, the one or more bias components operable to provide a bias resistance for the amplifying transistor, the one or more bias components comprising a control modulator coupled in series between the amplifying transistor and the ground, the control modulator operable to:
receive a first control signal;
enable the amplifying transistor in response to the first control signal;
receive a second control signal; and
disable the amplifying transistor in response to the second control signal; and
a capacitor coupled in parallel with the control modulator and operable to reduce variation of the amplified signal.

14. The amplifier of claim 13, wherein the one or more bias components are operable to provide the bias resistance for the amplifying transistor by:
decreasing a gate voltage in response to an increase in a drain current, the decrease in the gate voltage operable to stabilize the increase in the drain current; and
increasing the gate voltage in response to a decrease in the drain current, the increase in the gate voltage operable to stabilize the decrease in the drain current.

15. The amplifier of claim 13, wherein the control modulator comprises a field effect transistor.

16. The amplifier of claim 13, wherein the one or more bias components further comprises a resistor coupled in series to the control modulator.

17. The amplifier of claim 13, wherein the first control signal and the second control signal switch the modulating transistor with respect to the ground.

18. A method for amplifying a signal, comprising:
receiving a first control signal at a control modulator of one or more bias components, the one or more bias components coupled to an amplifying transistor, the amplifying transistor coupled to a ground, the control modulator coupled in series between the amplifying transistor and the ground;
enabling the amplifying transistor in response to the first control signal using the control modulator;
receiving a signal at the amplifying transistor;
amplifying the received signal using the amplifying transistor;
providing a bias resistance for the amplifying transistor using the one or more bias components coupled to the amplifying transistor;
receiving a second control signal at the control modulator;
disabling the amplifying transistor in response to the second control signal using the control modulator; and
reducing variation of the amplified signal using a capacitor coupled in parallel with the control modulator.

19. The method of claim 18, wherein providing the bias resistance for the amplifying transistor further comprises:
decreasing a gate voltage in response to an increase in a drain current, the decrease in the gate voltage operable to stabilize the increase in the drain current; and
increasing the gate voltage in response to a decrease in the drain current, the increase in the gate voltage operable to stabilize the decrease in the drain current.

20. The method of claim 18, wherein the control modulator comprises a field effect transistor.

21. The method of claim 18, wherein the one or more bias components further comprises a resistor coupled in series to the control modulator.

22. The method of claim 18, wherein the first control signal and the second control signal switch the modulating transistor with respect to the ground.

23. A system for amplifying a signal, comprising:
means for receiving a first control signal at a control modulator of one or more bias components, the one or more bias components coupled to an amplifying transistor, the amplifying transistor coupled to a ground, the control modulator coupled in series between the amplifying transistor and the ground;
means for enabling the amplifying transistor in response to the first control signal using the control modulator;
means for receiving a signal at the amplifying transistor;
means for amplifying the received signal using the amplifying transistor;

means for providing a bias resistance for the amplifying transistor using the one or more bias components coupled to the amplifying transistor;
means for receiving a second control signal at the control modulator; and
means for disabling the amplifying transistor in response to the second control signal using the control modulator.

24. An amplifier for amplifying a signal, comprising:
an amplifying transistor coupled to a ground and operable to:
  receive a signal; and
  amplify the received signal;
one or more bias components coupled to the amplifying transistor, the one or more bias components operable to provide a bias resistance for the amplifying transistor by:
  decreasing a gate voltage in response to an increase in a drain current, the decrease in the gate voltage operable to stabilize the increase in the drain current; and
  increasing the gate voltage in response to a decrease in the drain current, the increase in the gate voltage operable to stabilize the decrease in the drain current;
the one or more bias components comprising:
  a resistor coupled in series to the control modulator; and
  a control modulator coupled in series between the amplifying transistor and the ground, the control modulator comprising a field effect transistor and operable to:
    receive a first control signal;
    enable the amplifying transistor in response to the first control signal, the first control signal switching the modulating transistor with respect to the ground;
    receive a second control signal; and
    disable the amplifying transistor in response to the second control signal, the second control signal switching the modulating transistor with respect to the ground; and
a capacitor coupled in parallel with the control modulator and operable to reduce variation of the amplified signal.

* * * * *